United States Patent
Kang et al.

(10) Patent No.: US 7,751,233 B2
(45) Date of Patent: Jul. 6, 2010

(54) METHOD FOR EFFICIENTLY DRIVING A PHASE CHANGE MEMORY DEVICE

(75) Inventors: Hee Bok Kang, Chungcheonbuk-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 99 days.

(21) Appl. No.: 12/147,596

(22) Filed: Jun. 27, 2008

(65) Prior Publication Data

US 2009/0040817 A1 Feb. 12, 2009

(30) Foreign Application Priority Data

Aug. 10, 2007 (KR) .................. 10-2007-0080659

(51) Int. Cl.
*G11C 7/00* (2006.01)
(52) U.S. Cl. .................. 365/163; 365/145
(58) Field of Classification Search .......... 365/163, 365/145
See application file for complete search history.

(56) References Cited

U.S. PATENT DOCUMENTS

| 7,242,605 | B2 * | 7/2007 | Choi et al. | 365/148 |
| 7,522,449 | B2 * | 4/2009 | Ro et al. | 365/163 |
| 7,529,124 | B2 * | 5/2009 | Cho et al. | 365/163 |
| 7,542,356 | B2 * | 6/2009 | Lee et al. | 365/189.07 |
| 2005/0068804 | A1 | 3/2005 | Choi et al. | |

* cited by examiner

*Primary Examiner*—Michael T Tran
(74) *Attorney, Agent, or Firm*—Ladas & Parry LLP (57) ABSTRACT

A method for efficiently driving a phase change memory device is presented that includes the operational procedures of writing, reading, comparing and changing. The phase change memory device has a resistor configured to sense a crystallization state changed by currents so as to store data corresponding to the crystallization state. The writing operation writes data having a first state in a corresponding unit cell of the phase change memory device. The reading operation reads a cell data stored in the unit cell. The comparing operation compares the data having the first state with the cell data read from the unit cell to verify whether or not the data having the first state is the same as the cell data. The changing operation changes a write condition when the data having a first state is different from that of the cell data.

20 Claims, 13 Drawing Sheets

METHOD FOR EFFICIENTLY DRIVING A PHASE CHANGE MEMORY DEVICE

This application is based upon and claims the benefit of priority to Korean Patent Application No. 10-2007-80659, filed on Aug. 10, 2007, the entire contents of which are incorporated herein by reference.

BACKGROUND OF THE INVENTION

The embodiments relate generally to a method for driving a phase change memory device, and more particularly, to a methodical technique of changing a write condition when an initial cell write characteristic is different so as to perform a normal write operation.

Some well known nonvolatile memory storage devices include magnetic memories and a phase change memories (PCM). The PCM components can exhibit data processing speeds similar to that of a volatile Random Access Memory (RAM) components. Further PCM components enjoy the advantage of being able to conserves data even after the power is turned off.

Figure 1A:
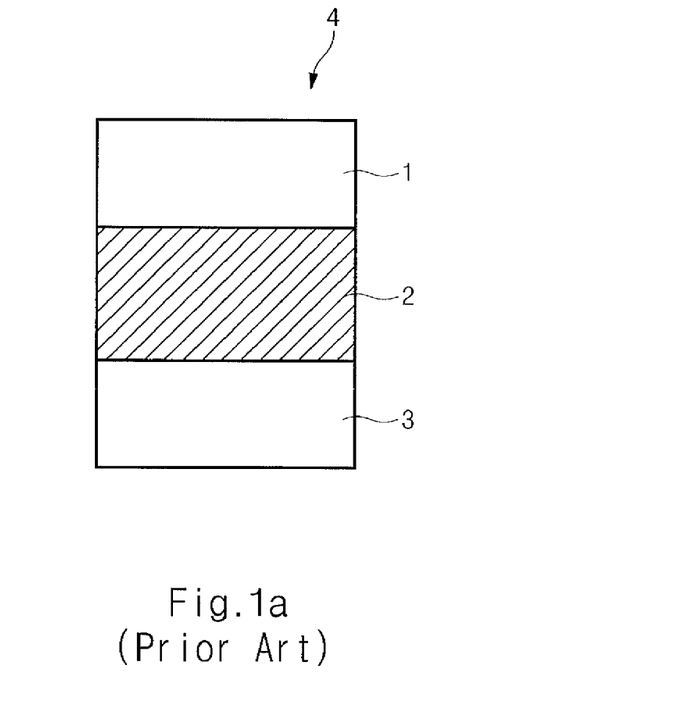
FIGS. 1a and 1b are diagrams illustrating a conventional phase change resistor.
Figure 1B:
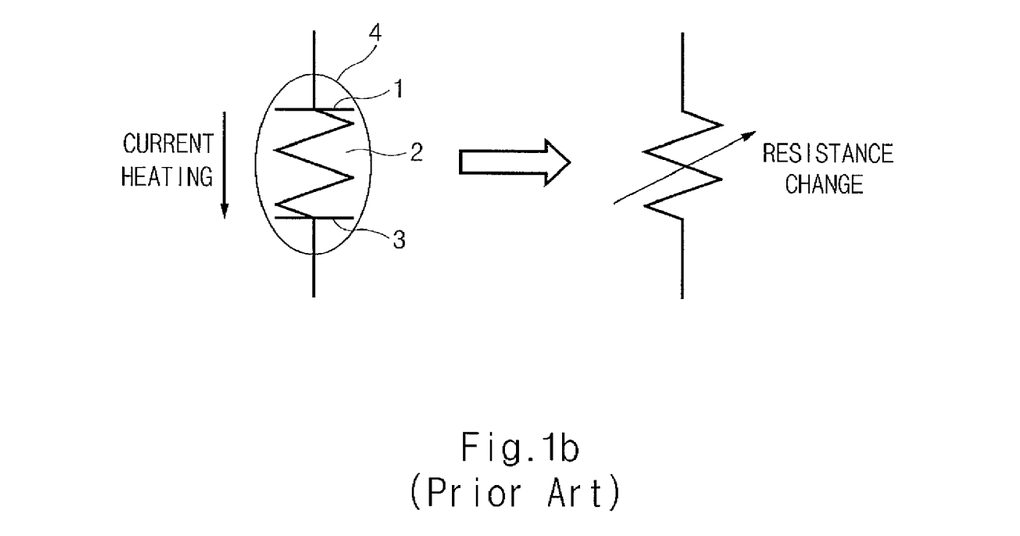

FIGS. 1a and 1b are diagrams illustrating a conventional phase change resistor (PCR) 4.

The conventional PCR 4 comprises a phase change material (PCM) 2 inserted between a top electrode 1 and a bottom electrode 3. When a voltage and a current are imposed across the top and bottom electrodes (1,3), the temperature is raised in the PCM 2 which results in altering the electric conductive properties and thereby the resistance changes as a function of the resultant solid state morphology. The PCM can include the chalcogenide, AgLnSbTe. The PCM 2 often times includes a chalcogenide having at least one of the chalcogen elements (S, Se, Te) as a main ingredient, and containing other ingredients such as, germanium and antimony. One PCM 2 of interest is the germanium antimonic tellurium consisting of Ge—Sb—Te (Ge2Sb2Te5).

Figure 2A:
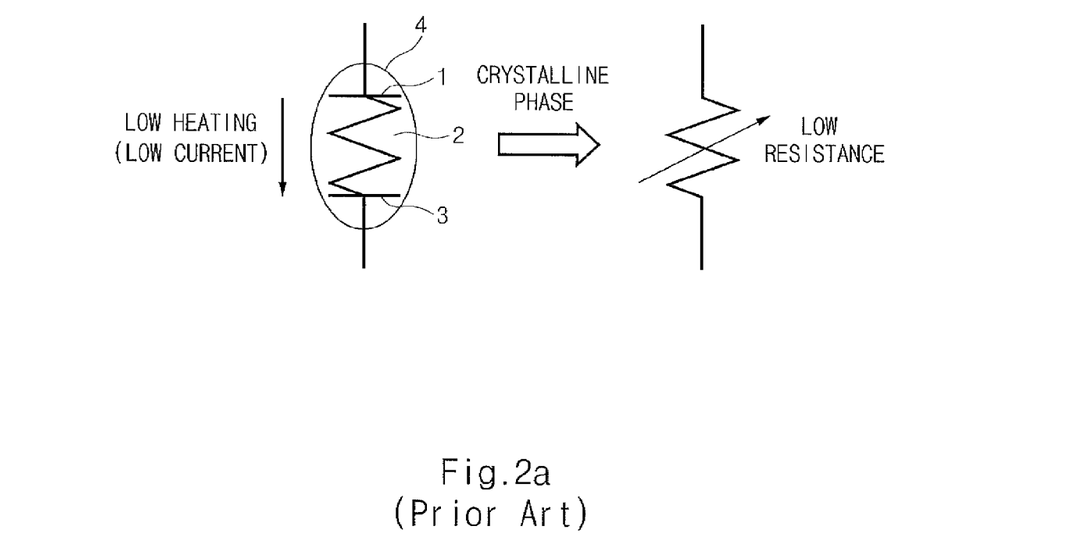
FIGS. 2a and 2b are diagrams illustrating a principle of the conventional phase change resistor.
Figure 2B:
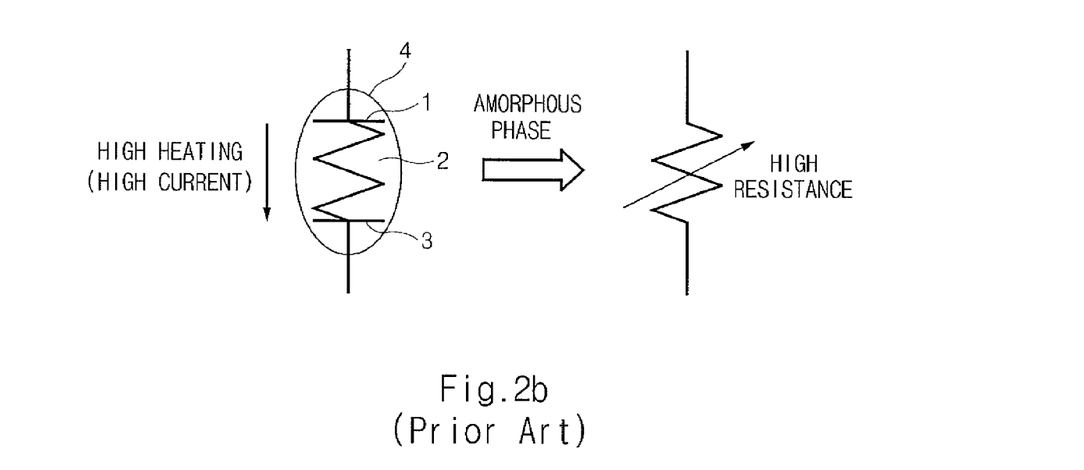

FIGS. 2a and 2b are diagrams illustrating a principle of the conventional PCR 4.

As shown in FIG. 2a, the PCM 2 can maintain its crystalline morphology when a low current of less than a threshold value flows is in the PCM 4. As a result, of the highly ordered crystalline morphology state of the PCM2, the crystalline form of the PCM 2 exhibits a relatively low resistance.

As shown in FIG. 2b, the crystalline morphological state of the PCM 2 can be induced to melt when a current of more than a threshold value is imposed across the PCR 4. As a result of raising the temperature above the crystalline melting temperature coupled by relatively rapid cooling of the melted PCM2, the solid state morphology of the PCM 2 can be transformed into an alternate solid state of being an amorphous morphology. Because of the increased number or increased density of crystal imperfections in these amorphous states, the amorphous PCM 2 exhibits a higher electrical resistance as compared to the PCM 2 in a crystalline state.

Accordingly, one can exploit this difference in physical properties by designing a PCR 4 to be configured to store nonvolatile data corresponding to the two resistance states. One could arbitrarily assign a data "1" state to refers to when the PCR 4 exhibits a relatively low resistance state. Likewise, one could arbitrarily assign a data "0" state to refer to when the PCR 4 exhibits a relatively high resistance state. Accordingly, binary logic states can be stored in these types of PCM devices without the need for powering these devices.

Figure 3:
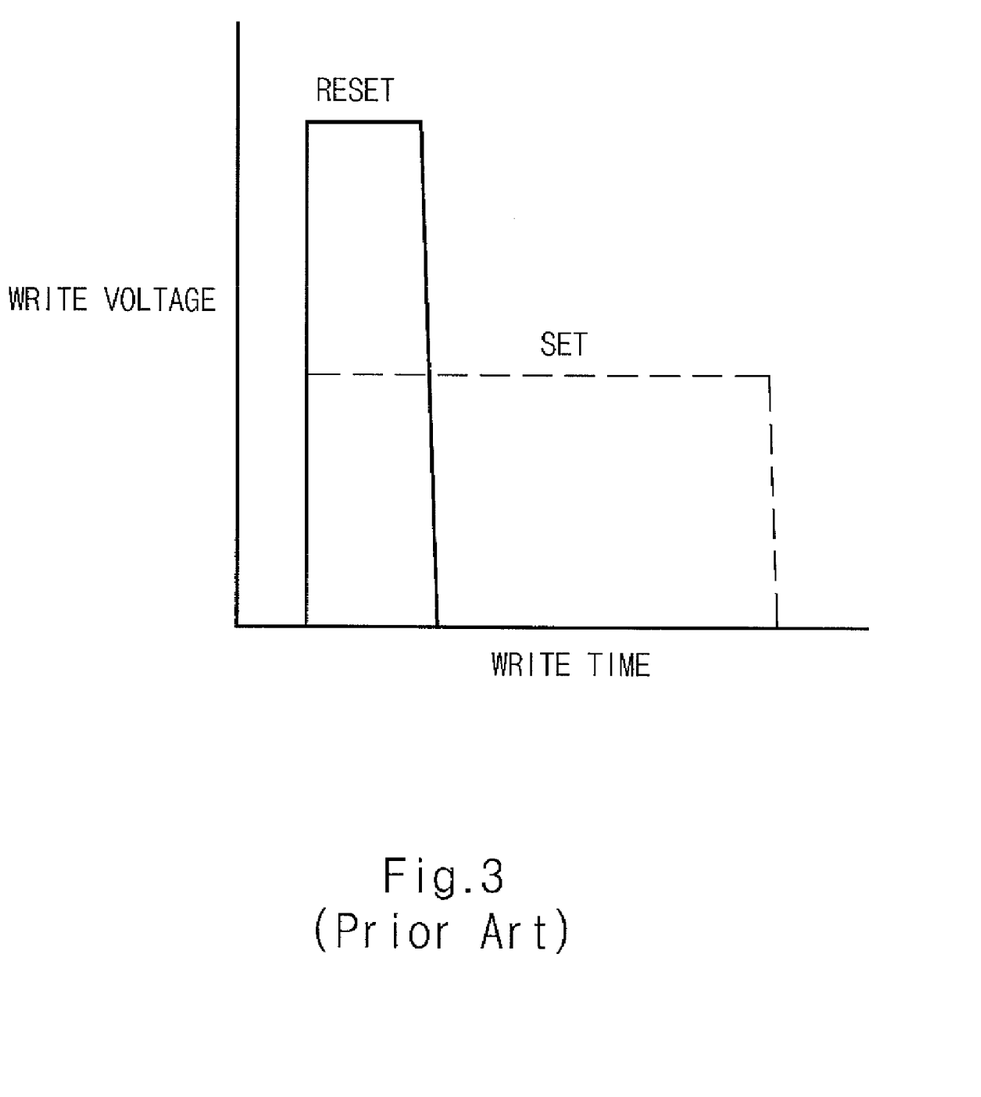
FIG. 3 is a diagram illustrating a write operation of a conventional phase change resistant cell.
Figure 4:
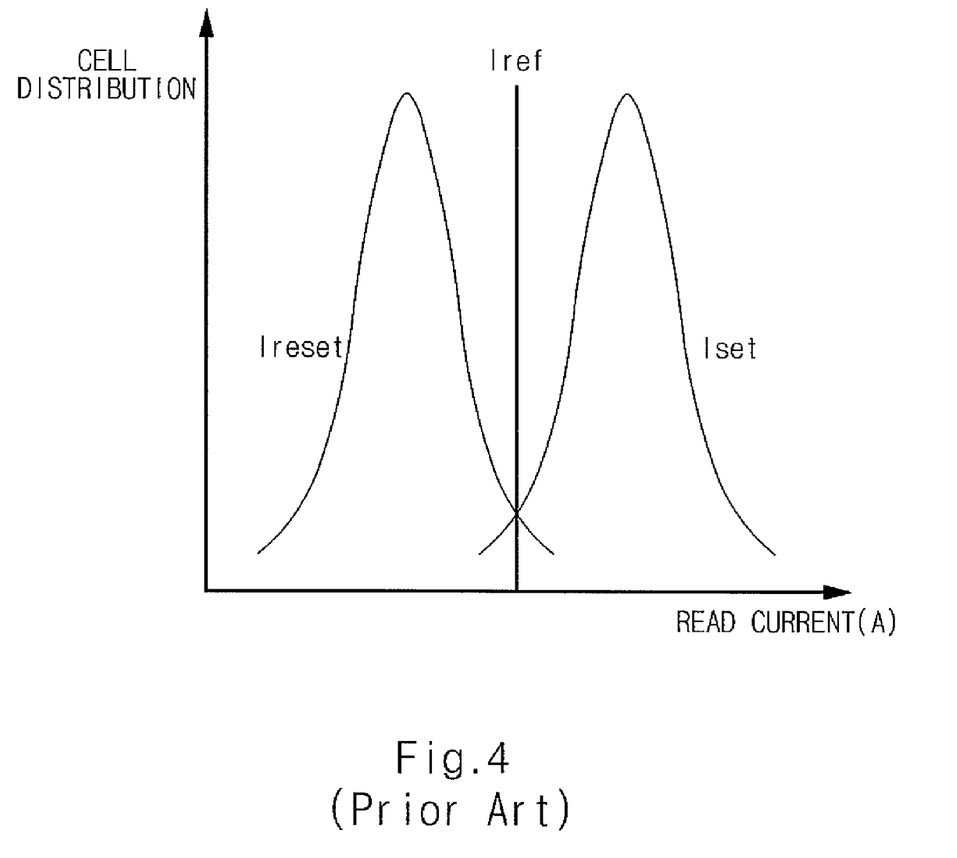
FIG. 4 is a diagram illustrating cell characteristic distribution of a conventional phase change memory device.

FIG. 3 is a diagram illustrating a write operation of a conventional phase change resistant cell.

When heat is generated from an electrical current flowing across the top electrode 1 and the bottom electrode 3 of the PCR 4, the solid state morphology of the PCM 2 can be transformed back and forth from a crystalline to an amorphous state when the heat is increased above the melting point.

In contrast, when heat is generated from a low amount of electrical current flowing across the top electrode 1 and the bottom electrode 3 of the PCR 4, the solid state morphology of the PCM 2 in the crystalline state can be maintained. As mentioned above, when the PCR 4 is in a crystalline state it exhibits a relatively lower resistance which can be arbitrarily defined to be a set state. On the other hand, when a high electrical current flows across the top electrode 1 and the bottom electrode 3 of the PCR 4, the PCM can be transformed into an amorphous state from the heating and from the rapid cooling. As a consequence when the PCR 4 is in the amorphous state it exhibits a relatively higher resistance which can be arbitrarily defined as a reset state A physical property difference between these two morphological solid state phases is the responsible agent for the changes in the electric resistances.

A low voltage is applied to the PCR 4 for a long time in order to allow the PCM 2 to transform into the crystalline state and thus write the set state in a write mode. On the other hand, a high voltage is applied to the PCR 4 for a short time in order to allow the melted PCM 2 to rapidly cool into the amorphous state and thus write the reset state in the write mode.

Figure 5:
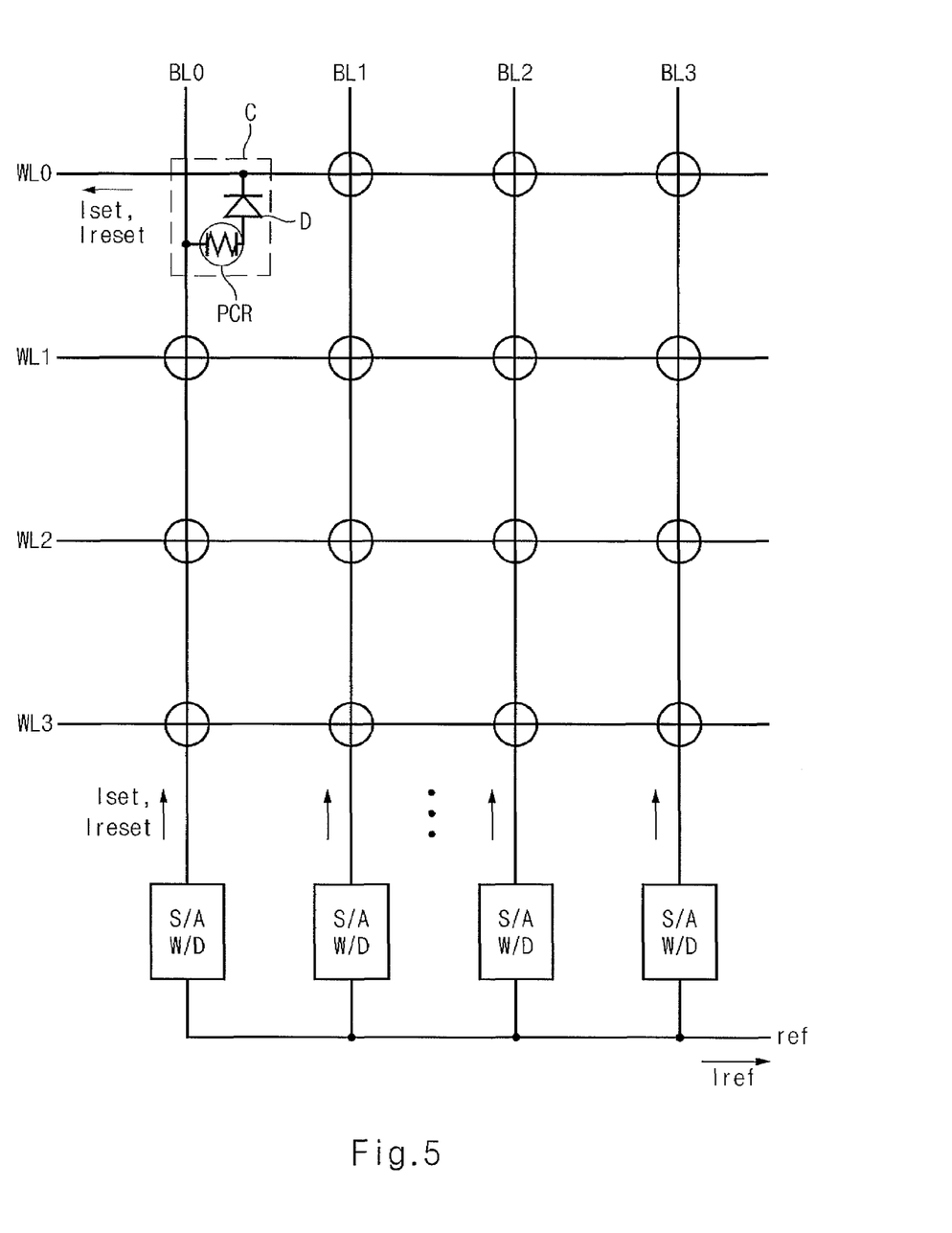
FIG. 5 is a diagram illustrating a cell array of a phase change memory device consistent with the invention.

FIG. 5 is a diagram illustrating cell characteristic distribution of a conventional phase change memory device.

Each cell includes in a plurality of cell arrays which has a different read current distribution because process, device and design conditions are different. That is, the distribution of a set current Iset and a reset current Ireset becomes broader based on a read current.

Based on a reference current Iref, read currents are overlapped with each other in a part of the cells. When the reset current Ireset and the set current Iset are distinguished by a reference current Iref, a fail condition occurs in a part of the cells.

SUMMARY OF THE INVENTION

Disclosed is a method for driving a phase change memory device.

Various embodiments are directed to reducing the number of reset and set operations in a phase change memory device including a phase change resistor to improve a write operating characteristic.

Various embodiments are directed to inducing set and reset write states to a stable region in a write mode.

Various embodiments are directed to driving set and reset write states stably to improve reliability of cells and a margin of a read sensing current.

Various embodiments are directed to changing a write condition when an initial cell write characteristic is different so as to obtain a normal set/reset write condition.

According to one embodiment, a method for driving a phase change device including a phase change resistor configured to sense crystallization state changed by currents so as to store a data corresponding to the crystallization state, the method comprises: writing a first data having a first state in a corresponding unit cell; reading a cell data stored in the unit cell; comparing the first data having the first state with the cell data read from the unit cell to verify whether or not the first data having the first state is substantially the same as the cell data; and changing a write condition when the first data having the first state is substantially different from the cell data.

DESCRIPTION OF SPECIFIC EMBODIMENTS

FIG. 5 is a diagram illustrating a phase change memory device consistent with the invention.

The phase change memory device includes a plurality of bit lines BL0~BL3 arranged in a row (i.e., horizontal) direction and a plurality of word lines WL0~WL3 arranged in a column (i.e., vertical) direction. A plurality of unit cells C is arranged where the bit lines BL0~BL3 are crossed with the word lines WL0~WL3. Each unit cell C includes a phase change resistor PCR and a diode D. The diode D includes a PN diode element.

The phase change resistor PCR has one electrode connected to the bit line BL and the other electrode connected to a P-type region of the diode D. An N-type region of the diode D is connected to the word line WL.

A low voltage is applied to the word line WL selected in a read mode. A read voltage Vread is applied to the bit line BL so that a read current Iset corresponding to a set state and a read current Ireset corresponding to a reset state flow toward the word line WL through the bit line BL, the phase change resistor PCR and the diode D.

A sense amplifier S/A compares cell data received from the bit line BL with the reference current Iref received from a reference line ref to distinguish data "1" from "0". A write driving unit W/D supplies a driving voltage corresponding to write data to the bit line BL when data is written in the cell.

Figure 6:
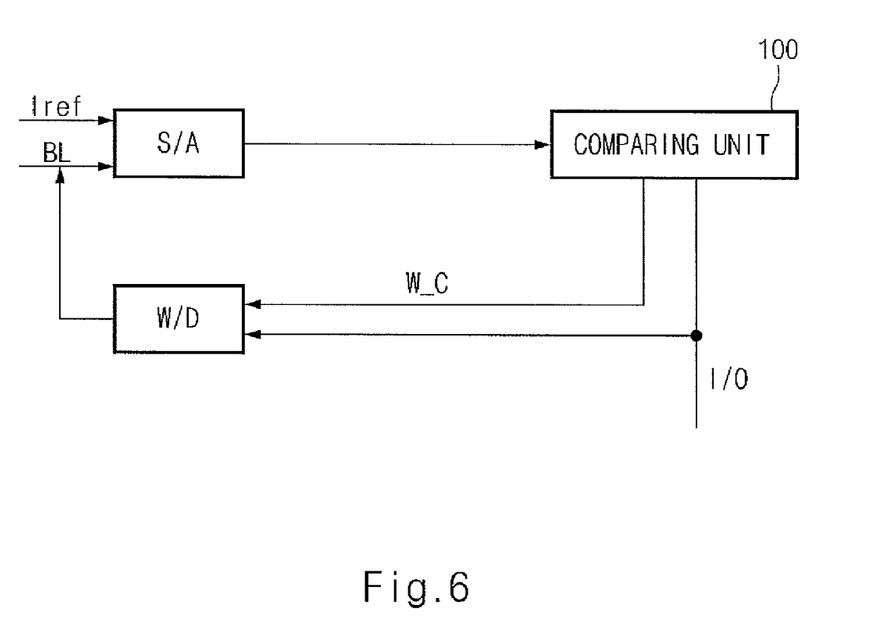
FIG. 6 is a diagram illustrating a sense amplifier, a write driving unit and a comparing unit of FIG. 5.

FIG. 6 is a diagram illustrating the sense amplifier S/A, the write driving unit W/D and a comparing unit 100 of FIG. 5.

The sense amplifier S/A compares the reference current Iref is with cell data received through the bit line BL. The write driving unit W/D supplies a driving voltage corresponding to write data to the bit line BL when data is written in the cell. The comparing unit 100 compares cell read data outputted from the sense amplifier S/A with write data received from input/output lines I/O to output a write control signal W_C.

The comparing unit 100 inactivates the write control signal W_C when cell read data outputted from the sense amplifier S/A is identical with write data received from the input/output lines I/O. When the write control signal W_C is inactivated, the operation of the write driving unit W/D is stopped.

The comparing unit 100 activates the write control signal W_C when the cell read data outputted from the sense amplifier S/A is different from the write data received from the input/output lines I/O. When the write control signal W_C is activated, the write driving unit W/D is operated to write new data through the bit line BL.

Figure 7:
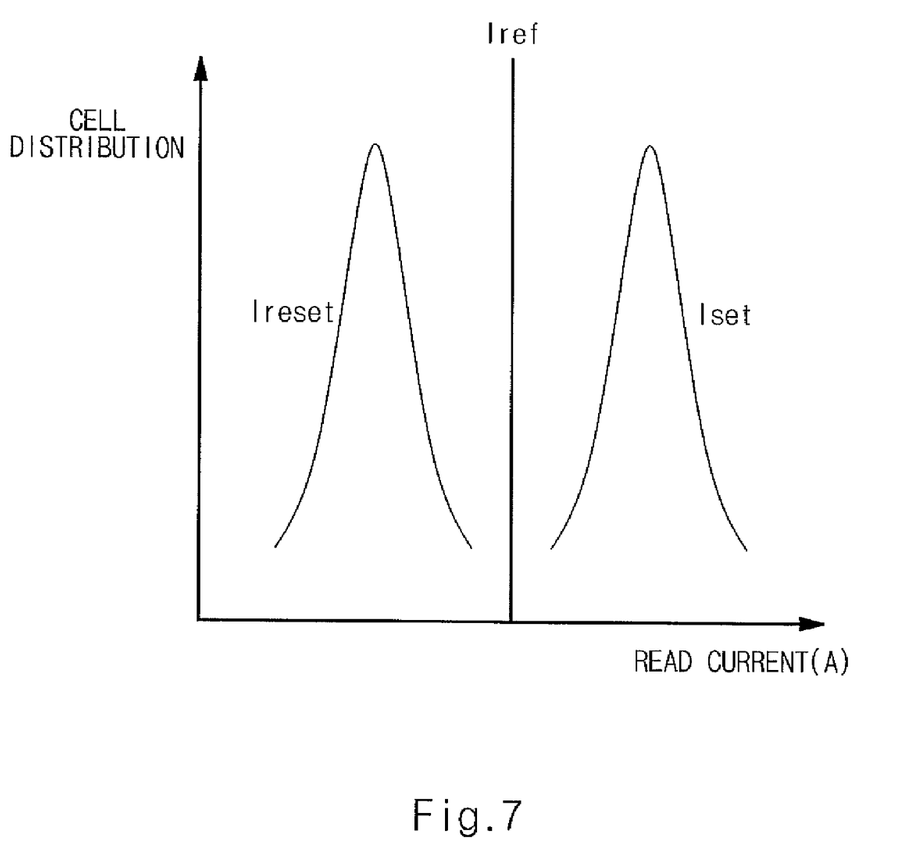
FIG. 7 is a diagram illustrating cell characteristic distribution of a phase change memory device consistent with the invention.

FIG. 7 is a diagram illustrating cell characteristic distribution of a phase change memory device consistent with the invention.

When a write cycle starts, original data stored in the unit cell C is read. Data of the unit cell C selected by the reference current Iref is read.

In other words, the reset current Ireset flowing through the bit line BL corresponds to a read current value lower than that of the reference current Iref. The set current Iset flowing through the bit line BL corresponds to a read current value higher than that of the reference current Iref.

In a write mode, set/reset data write operations and set/reset data read operations are repeated several times. When a fail condition occurs based on the reference current Iref, the set/reset write conditions are changed, and the set/reset data are written and verified repeatedly until the changed conditions are passed.

Although an initial cell write characteristic is different, the set/reset write conditions are changed to find out a normal set/reset write condition. As a result, it is possible to regulate distribution of all cells for storing set/reset data so as to have a pass condition.

Figure 8:
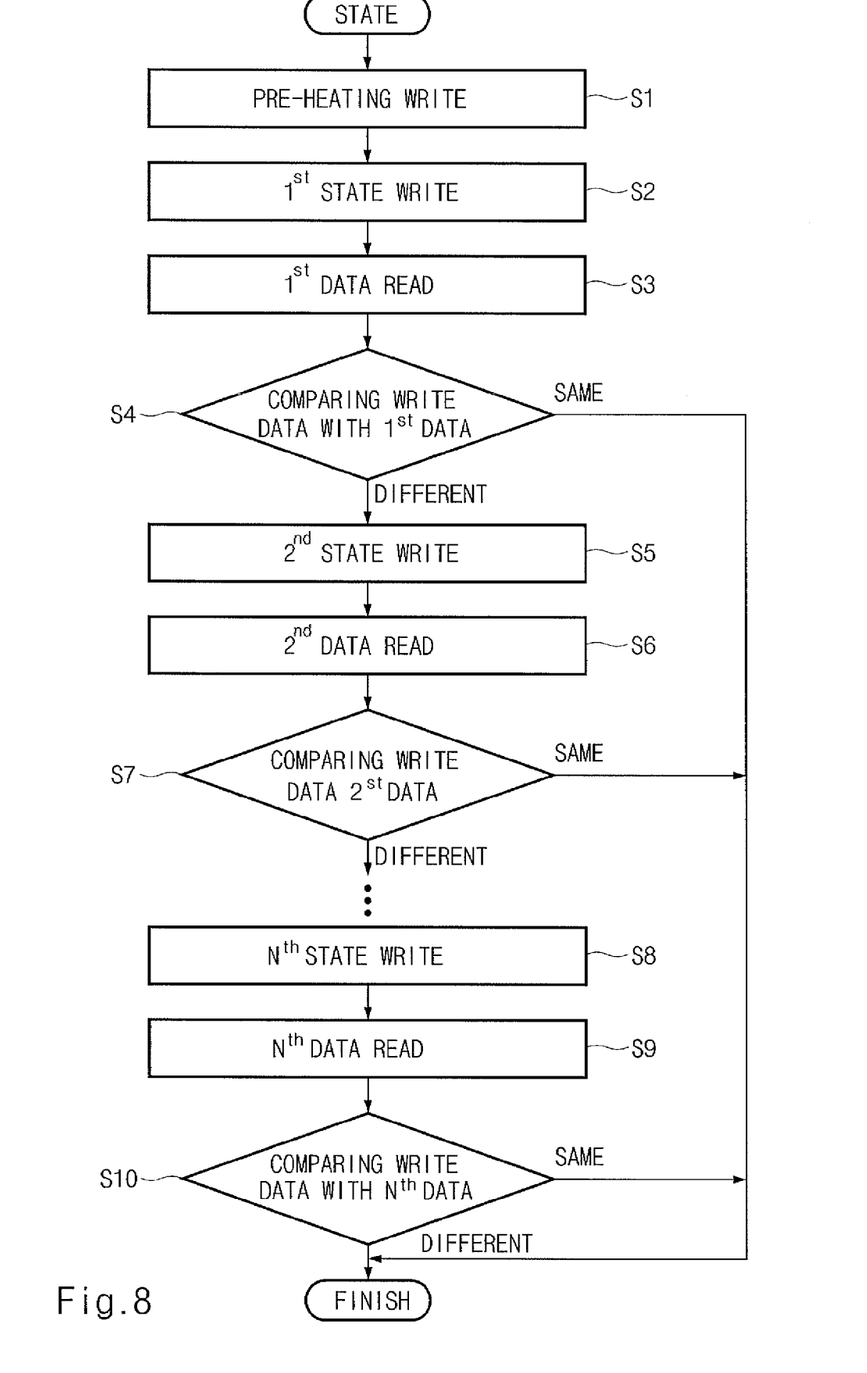
FIG. 8 is a flow chart illustrating a write cycle driving method of a phase change memory device consistent with the invention.

FIG. 8 is a flow chart illustrating a write cycle driving method of a phase change memory device consistent with the invention.

Figure 9:
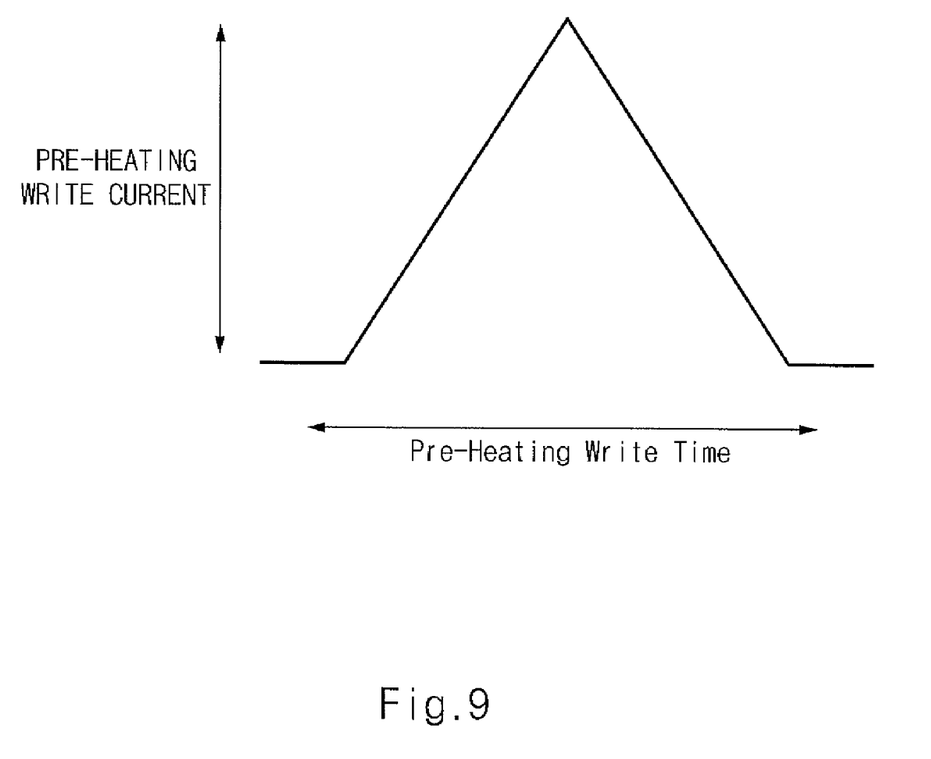
FIG. 9 is a diagram illustrating an operating waveform of a preheating write current in the driving method of FIG. 8.

At step S1, when the write control signal W_C is activated, a preheating write current for preheating the unit cell C is written as shown in FIG. 9. The preheating write current is generated by a driving voltage of the write driving unit W/D. The preheating write current is transmitted with a triangle waveform type as shown in FIG. 9, and gradually rises over a given current level. When reaching a target current value, the preheating write current gradually decreases as a curve function.

The preheating write current causes a heat annealing effect of the phase change resistor PCR, thereby improving reliability such as enhancing the endurance of the phase change resistor PCR and maintaining a regular initial write condition of the phase change resistor PCR.

When the write control signal W_C is activated, the preheating write current is supplied to the bit line BL so that the phase change resistor PCR of the unit cell C is warmed up. As a result, a first transmitted write condition is normally operated.

At step S2, the set or write voltage is supplied to the bit line BL to write a set or reset state having a first condition. At step S3, the data stored in the selected unit cell C is read.

The data of the selected unit cell C by the reference current Iref is read. The sense amplifier S/A compares the reference current Iref with cell data received through the bit line BL.

A low voltage is transmitted to the word line WL selected in the read mode. A read voltage Vread is transmitted to the bit line BL so that a read current Iset having a set state and a read current Ireset having a reset state flow toward the word line WL through the bit line BL, the phase change resistor PCR and the diode D.

At step S4, the comparing unit 100 compares read cell data read from the sense amplifier S/A with data written with a first state to output the write control signal W_C.

The comparing unit 100 inactivates the write control signal W_C when the cell data outputted from the sense amplifier S/A is identical with a logic value of the write data received from the input/output lines I/O. When the write control signal W_C is inactivated, the operation of the write driving unit W/D is stopped to write new data no longer.

When the data outputted from the sense amplifier S/A is identical with the write data received from the input/output lines I/O, data to be written is previously stored in a cell so that a new write operation is not performed. As a result, the number of reset and set write operations can be reduced.

The comparing unit 100 activates the write control signal W_C when the cell data outputted from the sense amplifier S/A is not identical with a logic value of write data received from the input/output lines I/O. When the write control signal W_C is activated, the write driving unit W/D is operated At step S5, the set or reset condition is changed to write new second set or reset state in the phase change resistor PCR through the bit line BL. As a result, the write driving unit W/D supplies a driving voltage corresponding to the write data to the bit line BL.

When the data to be written is set data, the write driving unit W/D writes new set data in the phase change resistor PCR to perform a verification operation on the set data. That is, a write operation condition is changed several times to perform the verification operation repeatedly until new set data is normally written.

When the data to be written is reset data, the write driving unit W/D writes new reset data in the phase change resistor PCR to perform a verification operation on the set data. That is, a write operation condition is changed several times to perform the verification operation repeatedly until new reset data is normally written.

The writing and verifying operations of new set data include writing, reading and verifying a plurality of set states until the read cell data is identical with write data.

At step S6, the second set or reset data stored in the corresponding unit cell C is read. The data of the unit cell C selected by the reference current Iref is read. The sense amplifier S/A compares the reference current Iref with cell data received through the bit line BL.

At step S7, the comparing unit 100 compares the read cell data read from the sense amplifier S/A with data written with a second state to output the write control signal W_C.

The comparing unit 100 inactivates the write control signal W_C when the cell data outputted from the sense amplifier S/A has the same logic value as that of the data having a second state. When the write control signal W_C is inactivated, the operation of the write driving unit W/D is stopped to write new data no longer.

In other words, when the cell data outputted from the sense amplifier S/A is identical with the data written to have a second state, the data to be written is normally stored not to write new data, thereby reducing the number of reset and set write operations.

At step S8, the comparing unit 100 activates the write control signal W_C when the cell data outputted from the sense amplifier S/A has a different logic value from that of the data having a second state. When the write control signal W_C is activated, the write driving unit W/D is operated. As a result, a set or reset write condition is changed to write an $n^{th}$ set or reset state in the phase change resistor PCR through the bit line BL.

At step S9, the $n^{th}$ set or reset data stored in the corresponding unit cell C is read. Data of the unit cell selected by the reference current Iref is read. That is, the n set or reset state having the changed write condition is written and read repeatedly.

The sense amplifier S/A compares the reference current Iref with the cell data received through the bit line BL. When the cell data read from the sense amplifier S/A is identical with data written with the $n^{th}$ state, the write operation is finished.

At step S10, when the cell data read from the sense amplifier S/A is identical with data written with the $n^{th}$ state, the write operation is finished and a redundancy operation is performed. That is, although n write/read operations are repeated, failed cells are rescued by a redundancy circuit.

Figure 10:
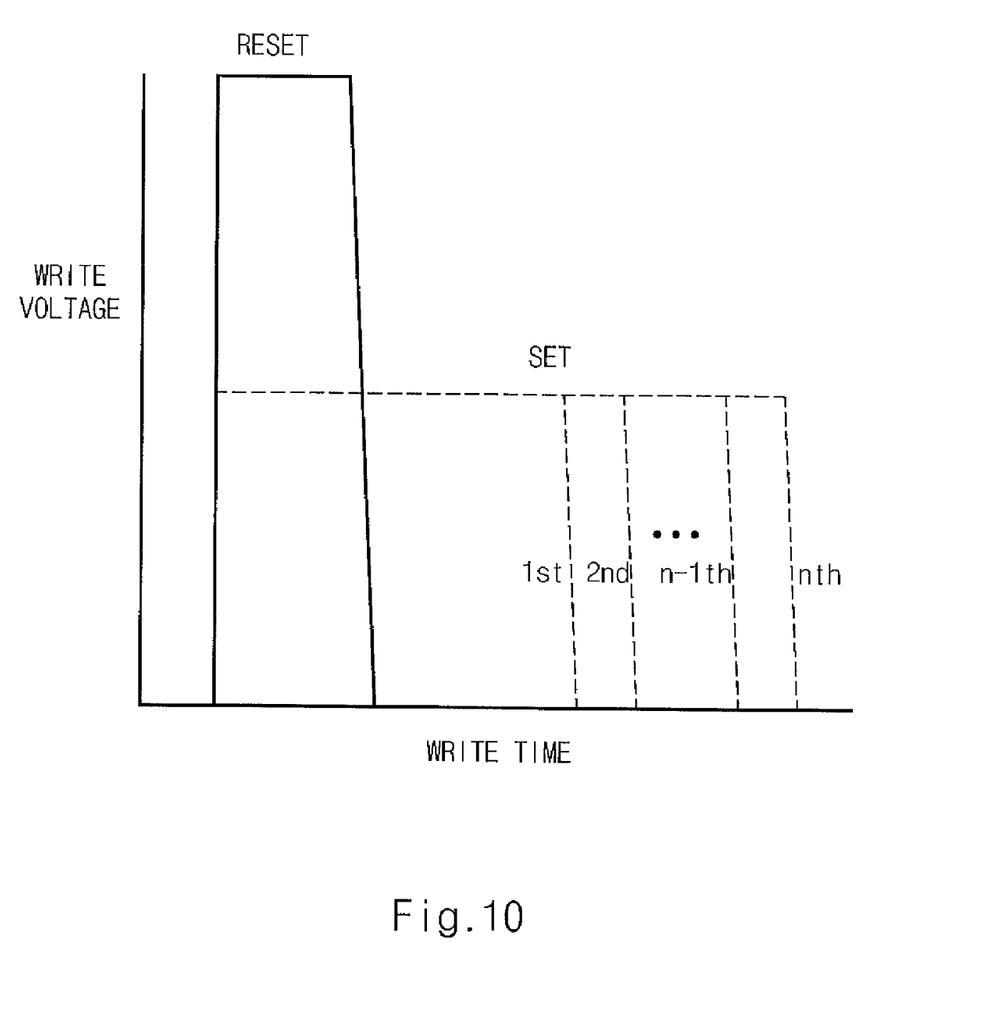
FIG. 10 is a graph illustrating a write driving method of a phase change memory device consistent with the invention.

FIG. 10 is a diagram illustrating a write method by a set time change a phase change memory device consistent with the invention.

The write driving unit W/D supplies a write voltage having a set state for a first write time to write and verify first set data. The first set data stored in the unit cell C is read with the reference current Iref. The first set data is compared to the cell data to test whether the first set data is identical with the cell data.

When the first set data is different from the cell data, the write driving unit W/D supplies the write voltage having a set state for a second write time to write and verify second set data.

The second cell data stored in the unit cell C is read with the reference current Iref. The second set data is compared with the cell data to test whether the second set data is identical with the cell data.

When the second set data is different from the cell data, the write driving unit W/D supplies the write voltage having a set state for a third write time to write and verify third set data.

The third cell data stored in the unit cell C is read with the reference current Iref. The third set data is compared with the cell data to test whether the third set data is identical with the cell data.

When the third set data is different from the cell data, the write driving unit W/D supplies the write voltage having a set state for an $n^{th}$ write time to write and verify $n^{th}$ set data.

The same write voltage is maintained to change a set pulse condition. A write time for changing the set pulse condition is sequentially increased from the first write time to the $n^{th}$ write time.

The $n^{th}$ write time is longer than the third write time which is longer than the second write time. The second write time is longer than the first write time.

When set data fail occurs, the same write voltage for transmitting a set voltage is applied. The write time having a set state is sequentially increased from the shortest time to the longest time. In this way, while the write time is increased to the $n^{th}$, set data can be normally written in the cells having failed set data.

Figure 11:
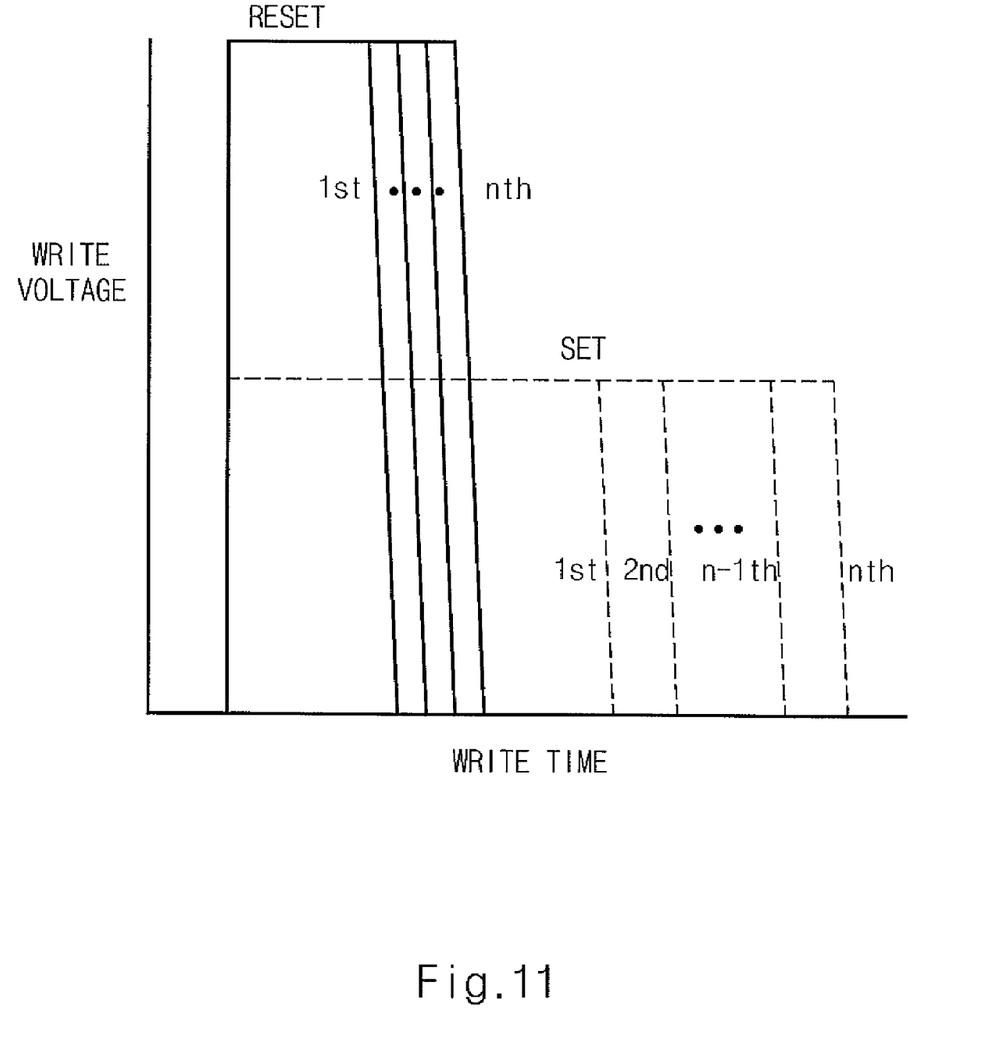
FIG. 11 is a graph illustrating a write driving method of a phase change memory device consistent with the invention.

FIG. 11 is a graph illustrating a write driving method by set and reset time change of a phase change memory device consistent with the invention.

The write driving unit W/D supplies a write voltage having a set state for a first write time to write and verify first set data. The first set data stored in the unit cell C is read with the reference so current Iref. The first set data is compared with the cell data to test whether the first set data is identical with the cell data.

When the first set data is different from the cell data, the write driving unit W/D supplies the write voltage having a set state for a second write time to write and verify second set data.

The second cell data stored in the unit cell C is read with the reference current Iref. The second set data is compared with the cell data to test whether the second set data is identical with the cell data.

When the second set data is different from the cell data, the write driving unit W/D supplies the write voltage having a set state for a third write time to write and verify third set data.

The third cell data stored in the unit cell C is read with the reference current Iref. The third set data is compared with the cell data to test whether the third set data is identical with the cell data.

When the third set data is different from the cell data, the write driving unit W/D supplies the write voltage having a set state for an $n^{th}$ write time to write and verify $n^{th}$ set data.

The same write voltage is maintained to change a set condition. A write time for changing the set condition is sequentially increased from the first write time to the $n^{th}$ write time.

The $n^{th}$ write time is longer than the third write time which is longer than the second write time. The second write time is longer than the first write time.

When set data fail occurs, the same write voltage for transmitting a set voltage is applied. The write time having a set state is sequentially increased from the shortest time to the longest time, and the set condition is changed several times.

When a data fail occurs in the first set write operation, the write time is increased for one step, that is, regulated long to perform a second set write operation. In this way, the write time is increased to the $n^{th}$ step so that set data can be normally written in the failed cells.

The write driving unit W/D supplies a write voltage having a reset state for the first writ time to write and verify first reset data. The first cell data stored in the unit cell c is read with the reference current Iref. The first reset data stored in the unit cell C is compared with the read cell data to test whether the first reset data stored in the unit cell C is identical with the read cell data.

When the first reset data is different from the cell data, the write driving unit W/D supplies the write voltage having a reset state for the second write time to write and verify second reset data.

The second cell data stored in the unit cell C is read with the reference current Iref. The second reset data is compared with the cell data to test whether the second reset data is identical with the cell data.

When the second reset data is different from the cell data, the write driving unit W/D supplies the write voltage having a reset state for the third write time to write and verify third reset data.

The third cell data stored in the unit cell C is read with the reference current Iref. The third reset data is compared with the cell data to test whether it is identical with the cell data.

When the third set data is different from the cell data, the is write driving unit W/D supplies the write voltage having a reset state for an $n^{th}$ write time to write and verify $n^{th}$ reset data.

The same write voltage is maintained to change a reset condition. A write time for transmitting a write voltage is sequentially increased from the first write time to the $n^{th}$ write time.

The $n^{th}$ write time is longer than the third write time which is longer than the second write time. The second write time is longer than the first write time.

When reset data fail occurs, the same write voltage for changing a reset state is applied. The write time having a reset state is sequentially increased from the shortest time to the longest time, and the set condition is changed several times.

When a data fail occurs in the first reset write operation, the write time is increased for one step, that is, regulated long to perform a second set write operation. In this way, the write time is increased to the $n^{th}$ step so that reset data can be normally written in the failed cells.

Figure 12:
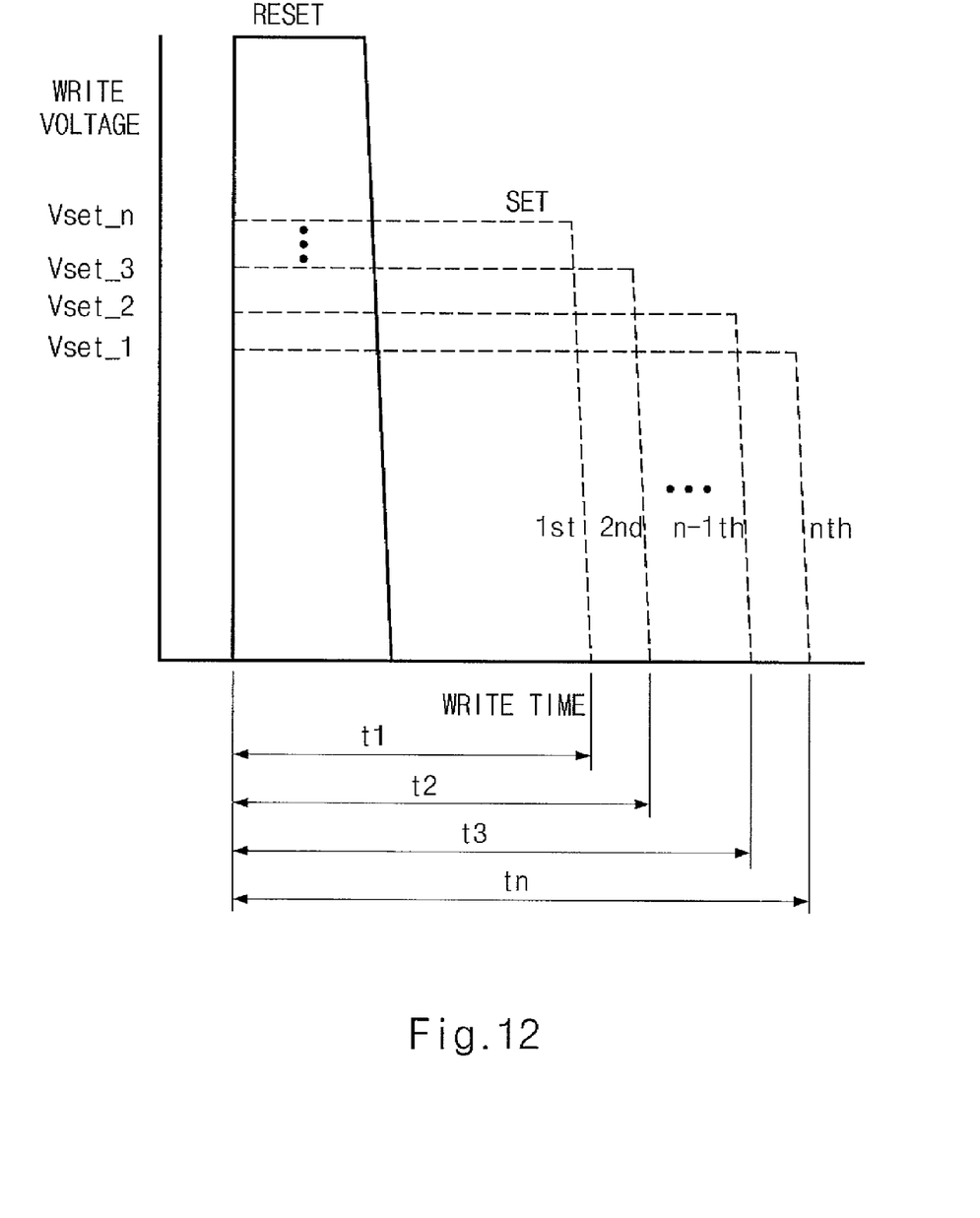
FIG. 12 is a graph illustrating a write driving method of a phase change memory device consistent with the invention.

FIG. 12 is a graph illustrating a write driving method by change of a set time and a set voltage of a phase change memory device consistent with the invention.

The write driving unit W/D supplies an $n^{th}$ write voltage Vset_n having a set state for a first write time (t1) to write and verify first set data. The first cell data stored in the unit cell C is read with the reference current Iref. The first set data is compared with the cell data to test whether the first set data is identical with the cell data.

When the first set data is different from the cell data, the write driving unit W/D supplies a third write voltage Vset_3 having a set state for a second write time (t2) to write and verify second set data.

The second cell data stored in the unit cell C is read with the reference current Iref. The second set data is compared with the cell data to test whether the second set data it is identical with the cell data.

When the second set data is different from the cell data, the write driving unit W/D supplies a second write voltage Vset_2 having a set state for a third write time (t3) write and verify third set data.

The third cell data stored in the unit cell C is read with the reference current Iref. The third set data is compared to the cell data to test whether the third set data is identical with the cell data.

When the third set data is different from the cell data, the write driving unit W/D supplies a first write voltage Vset_1 having a set state for an $n^{th}$ write time (tn) to write and verify $n^{th}$ set data.

The write voltage for changing a set condition is sequentially decreased from the $n^{th}$ write voltage Vset_n to the first write voltage Vset_1. The write time for changing a set condition is sequentially increased from the first write time (t1) to the $n^{th}$ write time (tn).

The $n^{th}$ write time (tn) is longer than the third write time (t3) which is longer than the second write time (t2). The second write time (t2) is longer than the first write time (t1).

The $n^{th}$ write voltage Vset_n is longer than the third write voltage Vset_3 which is longer than the second write voltage Vset_2. The second write voltage Vset_2 is longer than the first write voltage Vset_1.

When set data fail occurs, the write voltage Vset having a set state is sequentially decreased from the highest voltage level to the lowest voltage level, and the write time having a set state is sequentially increased from the shortest time to the longest time to change the set condition several times.

When a data fail occurs in the first set write operation, the write time is adjusted long for one step and the write voltage Vset is regulated low for one step to perform a second set write operation. In this way, the write time is increased to the $n^{th}$ step, and the write voltage Vset level is decreased so that set data can be normally written in failed cells.

That is, the write voltage serves as a variable for determining whether the phase change resistor PCR is over a melting point or not. A set characteristic is determined in the voltage below the melting point depending on the write time.

As a result, it is necessary to quench the phase change resistor PCR fast over the melting point when reset data is written. However, it is necessary to quench the phase change resistor PCR slow when the write voltage is supplied over the melting point.

In the set write operation, the write time can be reduced only when the optimum low voltage is found below the melting point. If possible, a write voltage condition is required to be closest to or below the melting point.

Since each cell has a different melting point, the voltage level is gradually lowered to find the optimum write voltage. That is, as the temperature becomes lower, a long write time is required. As a result, a write time is regulated to be long as the write voltage becomes lower.

Figure 13:
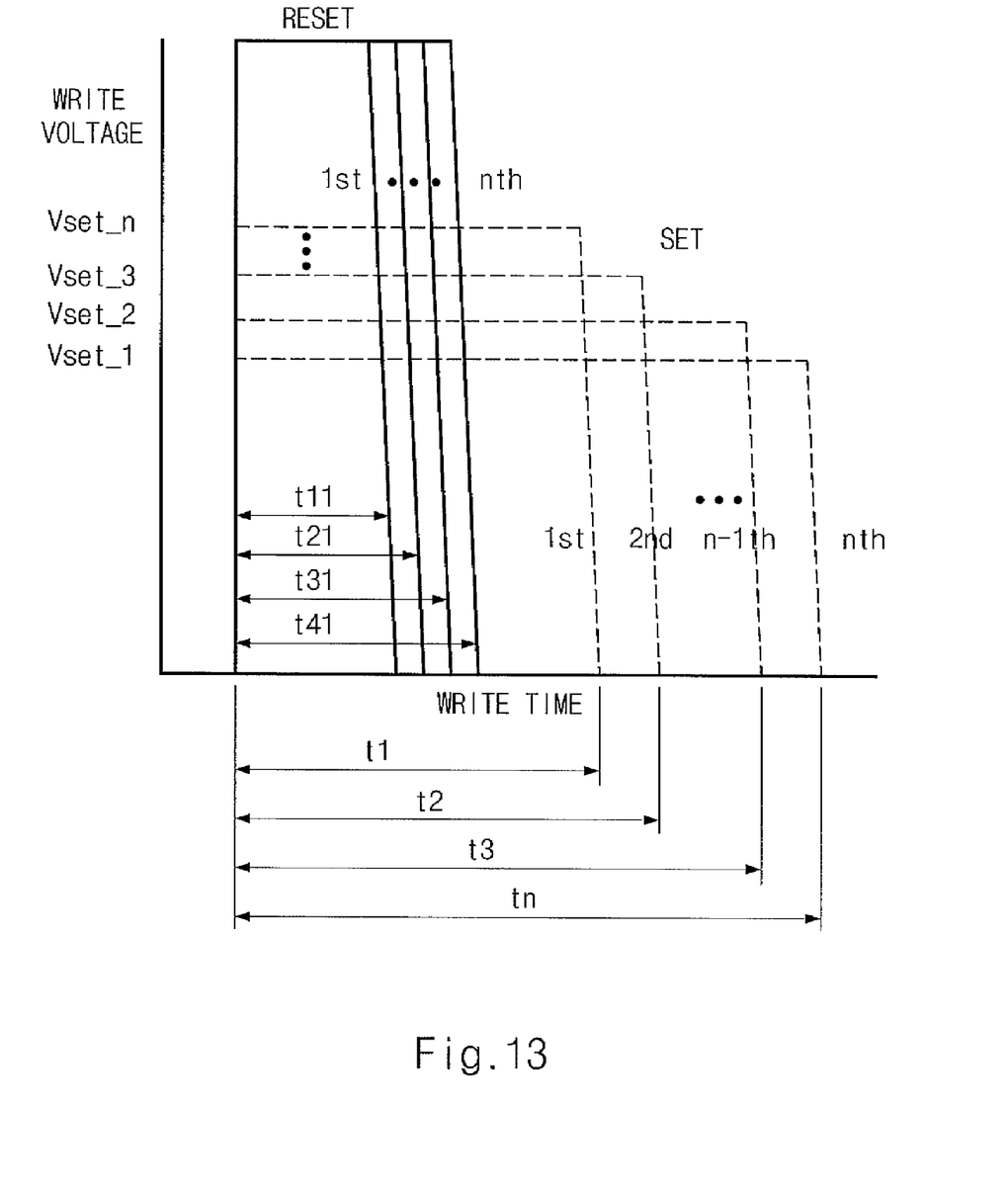
FIG. 13 is a graph illustrating a write driving method of a phase change memory device consistent with the invention.

FIG. 13 is a graph illustrating a write driving method of changing a set time, a set voltage and a reset time of a phase change memory device consistent with the invention.

The write driving unit W/D supplies a $n^{th}$ write voltage Vset_n having a set state for a first write time (t1) to write and verify first set data. The first cell data stored in the unit cell C is read with the reference current Iref. The first set data is compared with the cell data to test whether the first set data is identical with the cell data.

When the first set data is different from the cell data, the write driving unit W/D supplies a third write voltage Vset_3 having a set state for a second write time (t2) to write and verify second set data.

The second cell data stored in the unit cell C is read with the reference current Iref. The second set data is compared with the cell data to test whether the second set data is identical with the cell data.

When the second set data is different from the cell data, the write driving unit W/D supplies a second write voltage Vset_2 having a set state for a third write time (t3) write and verify third set data.

The third cell data stored in the unit cell C is read with the reference current Iref. The third set data is compared with the cell data to test whether the third set data is identical with the cell data.

When the third set data is different from the cell data, the write driving unit W/D supplies a first write voltage Vset_1 having a set state for a $n^{th}$ write time (tn) to write and verify $n^{th}$ set data.

The write voltage for changing a set condition is sequentially decreased from the $n^{th}$ write voltage Vset_n to the first write voltage Vset_1. The write time for changing a set condition is sequentially increased from the first write time (t1) to the $n^{th}$ write time (tn).

The $n^{th}$ write time (tn) is longer than the third write time (t3) which is longer than the second write time (t2). The second write time (t2) is longer than the first write time (t1).

The $n^{th}$ write voltage Vset_n is longer than the third write voltage Vset_3 which is longer than the second write voltage Vset_2. The second write voltage Vset_2 is longer than the first write voltage Vset_1.

When set data fail occurs, the write voltage Vset having a set state is sequentially decreased from the highest voltage level to the lowest voltage level, and the write time having a set state is sequentially increased from the shortest time to the longest time to change the set condition several times.

When a data fail occurs in the first set write operation, the write time is adjusted long for one step and the write voltage Vset is regulated low for one step to perform a second set write operation. In this way, the write time is increased to the $n^{th}$ step, and the write voltage Vset level is decreased so that set data can be normally written in failed cells.

The write driving unit W/D supplies a write voltage having a reset state for a first writ time (t11) to write and verify first reset data. The first cell data stored in the unit cell c is read with the reference current Iref. The first reset data is compared with the read cell data to test whether the first reset data stored in the unit cell C is identical with the read cell data.

When the first reset data is different from the cell data, the write driving unit W/D supplies the write voltage having a reset state for a second write time (t21) to write and verify second reset data.

The second cell data stored in the unit cell C is read with the reference current Iref. The second reset data is compared with the cell data to test whether the second reset data is identical with the cell data.

When the second reset data is different from the cell data, the write driving unit W/D supplies the write voltage having a reset state for a third write time (t31) to write and verify third reset data.

The third cell data stored in the unit cell C is read with the reference current Iref. The third reset data is compared with the cell data to test whether the third reset data is identical with the cell data.

When the third set data is different from the cell data, the write driving unit W/D supplies the write voltage having a reset state for a $n^{th}$ write time (t41) to write and verify $n^{th}$ reset data.

The same write voltage is maintained to change a reset condition. A write time for transmitting a write voltage is sequentially increased from the first write time (t11) to the $n^{th}$ write time (t41).

The $n^{th}$ write time (t41) is longer than the third write time (t31) which is longer than the second write time (t21). The second write time (t21) is longer than the first write time (t11).

The same write voltage for transmitting a reset voltage is applied. The write time having a reset state is sequentially increased from the shortest time to the longest time, and the set condition is changed several times.

When a data fail occurs in the first reset write operation, the write time is increased for one step, that is, regulated long to perform a second set write operation. In this way, the write time is increased to the $n^{th}$ step so that reset data can be normally written in the failed cells.

As described above, a method consistent with the invention reduces the number of reset and set operations in a phase change memory device including a phase change resistor to improve a write operating characteristic.

The method induces set and reset write states to a stable region in a write mode.

The method drives set and reset write states stably to improve reliability of cells and a margin of a read sensing current.

The method changes a write condition when an initial cell write characteristic is different so as to obtain a normal set/reset write condition.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combinations arrangement within the scope of the disclosure, the drawings and the appended claims. In addition to variations and modifications in the component parts and/or arrangements, alternative uses will also be apparent to those skilled in the art.

What is claimed is:

1. A method for driving a phase change device including a phase change resistor configured to sense a crystallization state changed by currents so as to store a data corresponding to the crystallization state, the method comprising:

writing a first data having a first state in a corresponding unit cell;

reading a cell data stored in the unit cell;

comparing the first data having the first state with the cell data read from the unit cell to verify whether or not the first data having the first state is substantially the same as the cell data; and changing a write condition when the first data having the first state is substantially different from the cell data, wherein the verifying operation in the step of comparing the first data having the first state with the cell data read from the unit cell includes changing a write condition of a set state.

2. The method according to claim 1, further comprising stopping the writing operation when the first data having the first state is substantially identical with the cell data.

3. The method according to claim 1, further comprising:
writing a second data having a second state in the unit cell;
reading the cell data stored in the unit cell; and
comparing the second data having the second state with the cell data read from the unit cell to verify whether or not the second data having the second state is substantially the same as the cell data.

4. The method according to claim 3, further comprising:
writing a third data having a third state in the unit cell;
reading the cell data stored in the unit cell; and
comparing the third data having the third state with the cell data read from the unit cell to verify whether or not the third data having the third state is substantially the same as the cell data.

5. The method according to claim 3, wherein the verifying operation in the step of comparing the second data having the second state with the cell data read from the unit cell verifies if the second data having the second state is substantially different from the cell data.

6. The method according to claim 5, further comprising finishing the write operation and performing a redundancy operation when a data having a $n^{th}$ state is different from a $n^{th}$ cell data.

7. The method according to claim 3, wherein the second data having the second state is a set data.

8. The method according to claim 3, wherein the second data having the second state is a reset data.

9. The method according to claim 1, wherein the step of changing the write condition when the first data having the first state is substantially different from the cell data includes writing the a set data by adjusting a write time while maintaining a write voltage of the set data at a constant level.

10. The method according to claim 9, including increasing the adjusted write time sequentially.

11. The method according to claim 1, wherein the changing step includes writing a set data by adjusting a write time and a write voltage of the set data.

12. The method according to claim 11, including increasing the write time sequentially and reducing the write voltage sequentially.

13. The method according to claim 1, wherein the verifying operation of the step of comparing the first data having the first state with the cell data read from the unit cell to include changing a write condition of a reset state.

14. The method according to claim 13, wherein the changing step includes writing a reset data by adjusting a write time while maintaining a write voltage of the reset data at a constant level.

15. The method according to claim 14, wherein the changing step includes writing the reset data includes increasing the write time sequentially.

16. The method according to claim 1, wherein the first data having the first state is a set data.

17. The method according to claim 1, wherein the first data having the first state is a reset data.

18. The method according to claim 1, further comprising supplying a preheating write current to preheat the phase change resistor.

19. The method according to claim 18, wherein the preheating step is performed before the first data having the first state is written in the corresponding unit cell.

20. The method according to claim 18, wherein the preheating write current is applied as a triangular waveform.

* * * * *